(12) United States Patent
Yonezawa et al.

(10) Patent No.: US 6,869,808 B2
(45) Date of Patent: Mar. 22, 2005

(54) METHOD FOR EVALUATING PROPERTY OF INTEGRATED CIRCUITRY

(75) Inventors: Hirokazu Yonezawa, Hyogo (JP); Satoshi Ishikura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 94 days.

(21) Appl. No.: 10/208,245

(22) Filed: Jul. 31, 2002

(65) Prior Publication Data

US 2003/0054577 A1 Mar. 20, 2003

(30) Foreign Application Priority Data

Aug. 1, 2001 (JP) ........................................ 2001-233527

(51) Int. Cl.[7] .............................................. H01L 31/26
(52) U.S. Cl. ............................ 438/14; 438/15; 438/17; 438/131
(58) Field of Search .............................. 438/11, 14, 15, 438/17, 18, 131; 257/48, 50, 53, 205; 713/600

(56) References Cited

U.S. PATENT DOCUMENTS

| | | | |
|---|---|---|---|
| 5,650,336 A | * | 7/1997 | Eriguchi et al. ............ 324/719 |
| 6,389,381 B1 | * | 5/2002 | Isoda et al. .................... 703/19 |
| 6,560,716 B1 | * | 5/2003 | Gasparik et al. ............ 713/600 |

FOREIGN PATENT DOCUMENTS

| | | |
|---|---|---|
| JP | 63-177437 | 7/1988 |
| JP | 4-160377 | 6/1992 |
| JP | 8-139279 | 5/1996 |
| JP | 11-118874 | 4/1999 |
| JP | 11-166960 | 6/1999 |

* cited by examiner

*Primary Examiner*—Carl Whitehead, Jr.
*Assistant Examiner*—Yennhu B. Huynh
(74) *Attorney, Agent, or Firm*—McDermott Will & Emery LLP

(57) ABSTRACT

There are provided a method for evaluating, in a reduced number of steps, a property of an integrated circuit reflecting operating conditions for an actual LSI and the design of the LSI. The property (delay) of a circuit A (ring oscillator) in a wafer or mounted chip is measured actually or simulated and the property of a circuit B (LSI) is simulated. Then, the interrelation between the degree of property degradation of the circuit A and the degree of property degradation of the circuit B is determined. The circuit property of a circuit AA (ring oscillator) having substantially the same degree of property degradation as the circuit A and manufactured under a new manufacturing condition is measured actually or simulated so that the degree of property degradation of a circuit BB is predicted from the interrelation and the degree of property degradation of the circuit AA. The circuit BB has substantially the same degree of property degradation as the circuit B and is manufactured under a new manufacturing condition.

8 Claims, 8 Drawing Sheets

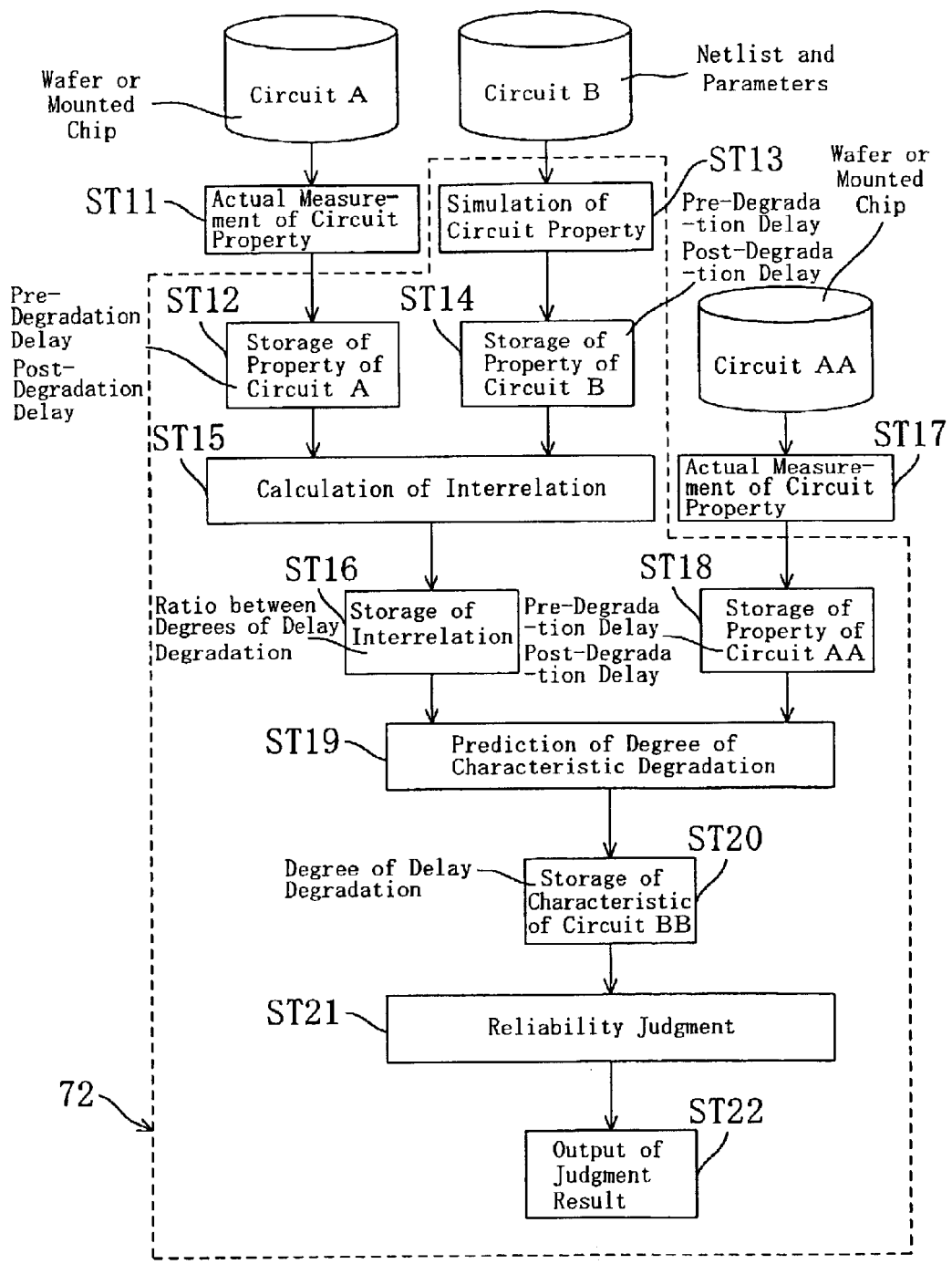

FIG. 2

| Circuit | Type of Circuit | Manufacturing Condition | Property Acquiring Method |
|---|---|---|---|
| Circuit A | Ring Oscillator | Existing Manufacturing Condition | Actual Measurement After Fabrication |
| Circuit B | L S I | Existing Manufacturing Condition | Simulation |
| Circuit AA | Ring Oscillator | New Manufacturing Condition | Actual Measurement After Fabrication |
| Circuit BB | L S I | New Manufacturing Condition | — |

FIG. 3

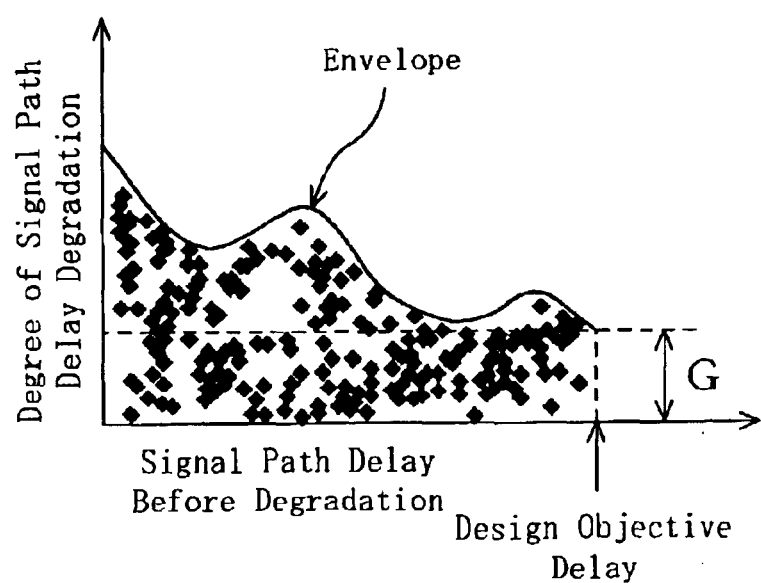

| Circuit | Degree of Degradation=(Post-Degradation Delay−Pre-Degradation Delay)/(Pre-Degradation Delay) |
|---|---|
| Circuit A | 3.0 |
| Circuit B | 1.0 |
| Circuit AA | 2.4 |
| Circuit BB | 0.8 |

METHOD FOR EVALUATING PROPERTY OF INTEGRATED CIRCUITRY

BACKGROUND OF THE INVENTION

To implement various functions on one chip, a recent CMIS semiconductor integrated circuit (hereinafter referred to as an LSI) is composed of more than several tens of millions of MIS transistors integrated therein. Like other products, the LSI also has a lifetime so that, after operating for a given post-manufacturing period, it may incur a failure or faulty operation. As major factors which cause the failure or faulty operation of the LSI, there have been known degradation of transistor properties resulting from a hot carrier degradation phenomenon or a bias temperature instability phenomenon, a broken line or a short circuit resulting from electromigration, and the like.

Because transistors composing an LSI have been miniaturized rapidly with the recent advances in manufacturing technology, a high electric field formed in the vicinity of the drain of each MIS transistor causes impact ionization of carriers so that hot carriers having high energy are more likely to be generated. The hot carriers may eventually result in faulty operation of the LSI since such carriers damage a gate oxide film, vary (degrade) the threshold voltage and drain current of a transistor with the passage of time, and resultantly change the property of operating frequency of the LSI composed of a group of transistors. To prevent this, measures should be taken by performing proper reliability evaluation against the hot carriers in the manufacturing process for the LSI or allowing for a design margin for ensuring reliability in accordance with a desired product lifetime in the design of the LSI.

FIG. 8 is a flow chart illustrating a typical process flow from the development of a device to the mass production thereof. First, process development is performed in Step ST101. Then, device evaluation is performed in Step ST102 and LSI design is performed in Step ST103, while it is judged in Step ST104 whether or not the device has any reliability problem. The process is improved till it is judged in Step ST104 that the device has no more reliability problem. On the other hand, it is judged in Step ST105 whether or not the LSI design performed in Step ST103 has any problem. The process flow moves to Step ST106 of LSI mass production if the device is judged to have no more reliability problem and if the LSI design is judged to have no more problem judgment process in Step ST105).

As shown in FIG. 9, an LSI can typically be decomposed into basic units, signal path 130, each composed of flip-flops 131 and circuits 132 which are disposed in several stages (N stages in FIG. 9) between the flip-flops 131. Each of the circuits 132 is mostly composed of logic circuits and a wiring providing a connection therebetween. A signal propagating through the series of circuits in each of signal paths is required to have a delay falling within a specified period determined by the cycle time of a clock signal 133 (which is mostly an inverse number of the operating frequency or clock frequency). The resulting relation is given by the following expression (1):

$$t\ \text{cycle} \geq \Sigma ti + K \quad i=1\ \text{to}\ N \tag{1}$$

where t cycle is the cycle time as a design objective property, $\Sigma$ ti is the total sum of signal propagation delays between the respective input and output terminals of the circuits i between the flip-flops, i.e., a signal path delay before degradation, and K is the sum of set-up times for the flip-flops 131 and the skews of the clock signal 133.

The signal path delay is not constant relative to the operating time of the LSI and varies due to hot carrier degradation as shown in the following expression (2):

$$t\ \text{cycle} \geq \Sigma[ti + \Delta ti] + K \quad i=1\ \text{to}\ N \tag{2}$$

where $\Sigma\ \Delta ti$ is a variation in signal path delay due to degradation. The variation in delay due to the hot carrier degradation normally increases with the passage of time, though it differs depending on the types of circuits and operating conditions for each of the circuits including power-supply voltage, temperature, the number of times of operations, the slope of input signals, the direction of signal transition (rising or falling), output signal load, and manufacturing fluctuation. If consideration is thus given even to time-varying degradation, the right side of the expression (2) should fall within the cycle time.

To ensure the product lifetime of an LSI, it is necessary to design the LSI by preliminarily considering the influence of increased delay due to degradation and check whether or not a problem arises under the influence in evaluating the reliability of the LSI after manufacturing.

For conventional reliability evaluation, a ring oscillator circuit composed of a plurality of inverters 41 connected in a loop configuration to oscillate, such as the one shown in FIG. 10, has been used frequently. FIG. 11 shows the relationship between the operation time of the circuit and the degree of delay degradation. As shown in FIG. 11, the amount of delay degradation increases with the operating time. Reliability evaluation is performed by judging whether or not the degree G of delay degradation at the end of a lifetime T (e.g., ten years) to be guaranteed is equal to or less than a permissible value. The degree G of delay degradation also serves as a minimum time-varying degradation margin to be allowed for in LSI design. Since the degree of degradation can be determined by the reliability evaluating process (Step ST102) in FIG. 8, data on an amount of time-varying degradation margin (which will be described later) is transmitted to the LSI design (Step ST103).

In general, if a margin provided in designing an LSI, i.e., a design margin is excessively large, it guarantees excessively high reliability to the LSI. The reliability and performance of the LSI are generally in trade-off relation so that excessively high reliability imparted to the LSI eventually reduces the performance (e.g., operating frequency) of the LSI. If the design margin is excessively small, reliability becomes insufficient and faulty operation may occur in future before an objective product life expires. If a proper amount of time-varying degradation margin, which is one of design margins, cannot be determined, it becomes difficult to develop an LSI of which high performance and high reliability are required, such as a microprocessor.

Unlike an item, such as a microprocessor, for which a custom design scheme is used frequently, an application specific LSI such as ASIC is mostly designed by a labor-saving method using various delay varying factors termed derating factors, which are expressed as coefficients. In accordance with the method, design is performed by estimating a delay value under a worst condition from a standard delay value in a simple and easy manner, as represented by the following expression (3):

$$t\ \text{worst (Before Degradation)} = t\ \text{typ (Before Degradation)} \times P \times V \times T \tag{3}$$

where t worst is a worst value of all signal path delays, t typ is a standard value of all the signal path delays before degradation, P is a delay varying coefficient due to manufacturing fluctuation, V is a delay varying coefficient due to a power-supply voltage range, and T is a delay varying coefficient due to a temperature range.

In this case, the standard value of all the signal path delays is obtained by simulation and the worst value is obtained by using, as a design margin, a value obtained by simply multiplying the standard value by the derating factors P, V, and T. The right side of the expression (3) corresponds to "Σti" in the expression (1).

In design performed by considering the time-varying degradation margin, a value obtained by newly adding, as a derating factor G, a permissible value of the degree of delay degradation of FIG. 11, i.e., the time-varying degradation margin to the expression (3) and multiplying the standard value by the derating factors P, V, T, and G is used as the design margin so that the delay value under the worst condition after degradation is calculated in a simple and easy manner from the standard delay value before degradation, as represented by the following expression (4):

$$t \text{ worst (After Degradation)} = t \text{ typ (Before Degradation)} \times P \times V \times T \times G \quad (4).$$

Design is performed such that the delay calculated in accordance with the expression (4) falls within the range of design objective delays. In that case, the expression (3) was used to obtain the delay value under the worst condition from the standard delay value before degradation.

However, the conventional reliability evaluation using the ring oscillator has the following problems.

Although the conventional reliability evaluation has performed measurement and evaluation by manufacturing a ring oscillator on a per generation basis, it requires an extremely large number of steps since, in normal process development, reliability should be performed repeatedly under different manufacturing conditions till a manufacturing condition is finally determined.

Although the conventional method has used the ring oscillator circuit composed of logic gates of one type, such as inverters, which are connected to each other as shown in FIG. 10, a circuit in an LSI is composed of logic circuits of different types so that the ring oscillator composed of logic gates of one type is not representative of the properties of the LSI. In accordance with the conventional method, therefore, it is difficult to perform the evaluation of reliability reflecting an actual LSI. For this reason, the conventional ring oscillator for reliability evaluation has been designed to have a large output load capacitance and a large input slope, which are conditions for accelerating degradation, so that the degree of degradation becomes higher than that of a circuit with a highest degree of degradation in the LSI. In the conventional design, therefore, an excessively strict standard should inevitably be provided for reliability evaluation. It is inevitable for the time-varying degradation margin and the derating factors to become excessively large because they were obtained as a result of reliability evaluation performed under excessively strict conditions. Thus, the use of the excessively large time-varying degradation margin and derating factors has rendered LSI design difficult and caused the problem of partially sacrificing the performance of the LSI.

It may be possible to perform evaluation by directly analyzing the reliabilities of LSIs on a per generation basis by simulation, instead of the foregoing reliability evaluation using the ring oscillator. However, simulation of each of the LSIs performed under each of process conditions on a per generation basis increases the number of steps and is therefore difficult. It may also be possible to perform evaluation by actually measuring LSIs manufactured by processes belonging to the same generation. However, it is not realistic in terms of time and the number of steps required for manufacturing and evaluation.

SUMMARY OF THE INVENTION

It is therefore an object of the present invention to provide a method for evaluating, in a reduced number of steps, a property of an integrated circuit reflecting operating conditions for an actual LSI and the design of the LSI.

A method for evaluating a property of an integrated circuit which varies depending on a manufacturing condition therefor according to the present invention comprises the steps of: (a) obtaining respective properties of first and second circuits each manufactured under a first manufacturing condition before and after the properties thereof are degraded as a result of using the first and second circuits for a specified period; and (b) determining, based on the properties before and after degradation obtained in the step (a), an interrelation between respective degrees of property degradation of the first and second circuits.

In accordance with the method, the interrelation between the respective degrees of property degradation of the two different circuits under a given manufacturing condition can be determined so that an important criterion that can be used for evaluating the properties, e.g., reliabilities, of different circuits is obtainable.

The method further comprises the steps of: (c) determining a degree of degradation of a property of a third circuit manufactured under a second manufacturing condition, a difference between the respective degrees of property degradation of the first and third circuits being within a specified range; and (d) estimating, based on the interrelation and on the degree of property degradation of the third circuit, a degree of degradation of a property of a fourth circuit manufactured under the second manufacturing condition, a difference between the respective degrees of property degradation of the second and fourth circuits being within a specified range. The arrangement allows the degree of property degradation of the fourth circuit to be estimated by so called extrapolation by using the interrelation between the respective degrees of property degradation of the first and second circuits and the degree of property degradation of the third circuit. Accordingly, property evaluation can be performed in a reduced number of steps and at an early stage without performing actual measurement or simulation for property evaluation of, e.g., each of LSIs of different types on a per generation basis.

Preferably, the degree of property degradation of the third circuit is substantially the same as the degree of property degradation of the first circuit and the degree of property degradation of the fourth circuit is substantially the same as the degree of property degradation of the second circuit.

Respective ring oscillators are used as the first and third circuits and respective logic circuits are used as the second and fourth circuits. This allows rapid estimation of the degree of property degradation of the logic circuit based on the degree of property degradation, such as the degree of delay degradation, of the ring oscillator and allows rapid reliability evaluation.

Each of the steps (a) to (c) can include obtaining the property of any one of the first, second, and third circuits by simulation and obtaining the respective properties of the other circuits by actual measurement after manufacturing.

A delay in each of the circuits is used as the property of the circuit. This allows a delay property, which is an important factor in evaluating the reliability of an LSI, to be evaluated easily in a reduced number of steps.

The step (a) can include using, as the degree of property degradation of each of the first and second circuits, a value obtained by dividing, by the property before degradation, a value obtained by subtracting the property before degradation from the property after degradation resulting from the use of the circuit and the step (b) can include using, as the interrelation, a ratio between the respective degrees of degradation of the circuits.

The method further comprises the step of comparing, for judgment, the estimated degree of property degradation of the fourth circuit or the property after degradation obtained therefrom with a predetermined permissible value. The arrangement allows pass/fail estimation or pass/fail judgment of the reliability of the fourth circuit newly designed.

The third circuit contains substantially the same elements as the first circuit and the fourth circuit contains substantially the same elements as the second circuit. Even if the third and fourth circuits are manufactured by processes belonging to the same generation under two manufacturing conditions using different process parameters, the arrangement allows rapid and easy evaluation of the property of the fourth circuit.

A method for designing an integrated circuit according to the present invention comprises the steps of: (a) obtaining respective delays in first and second circuits each manufactured under a first manufacturing condition before and after the delays therein are degraded as a result of using the first and second circuits for a specified period; (b) determining, based on the delays before and after degradation obtained in the step (a), an interrelation between respective degrees of delay degradations of the first and second circuits; (c) determining a degree of delay degradation of a third circuit manufactured under a second manufacturing condition, a difference between the respective degrees of delay degradation of the first and third circuits being within a specified range; (d) estimating, based on the interrelation and on the degree of delay degradation of the third circuit, a degree of delay degradation in a fourth circuit manufactured under the second manufacturing condition after the delay therein is degraded as a result of using the fourth circuit for a specified period, a difference between the degree of delay degradation of the second circuit and a degree of delay degradation of the fourth circuit being within a specified range; (e) obtaining, as a derating factor, the degree of delay degradation in the fourth circuit after degradation which is estimated in the step (d); and (f) designating, as a design margin, the derating factor alone or in combination with at least one of power-supply voltage variation, temperature variation, and manufacturing fluctuation.

The method allows reliability evaluation reflecting an actual manufacturing condition. As a result, an excessively large design margin is no more provided and an integrated circuit can be designed based on a proper design margin.

Preferably, the degree of delay degradation of the third circuit is substantially the same as the degree of delay degradation of the first circuit and the degree of delay degradation of the fourth circuit is substantially the same as the degree of delay degradation of the second circuit.

BRIEF DESCRIPTION OF THE DRAWINGS

FIG. 1 is a flow chart illustrating a method for evaluating the reliability of an integrated circuit according to a first embodiment of the present invention;

FIG. 2 is a table showing the respective definitions of circuits used in the first embodiment;

FIG. 3 shows actually measured values representing the relationship between signal path delay before degradation and the degree of signal path delay degradation of an LSI;

DETAILED DESCRIPTION OF THE INVENTION

Figures 4, 5:
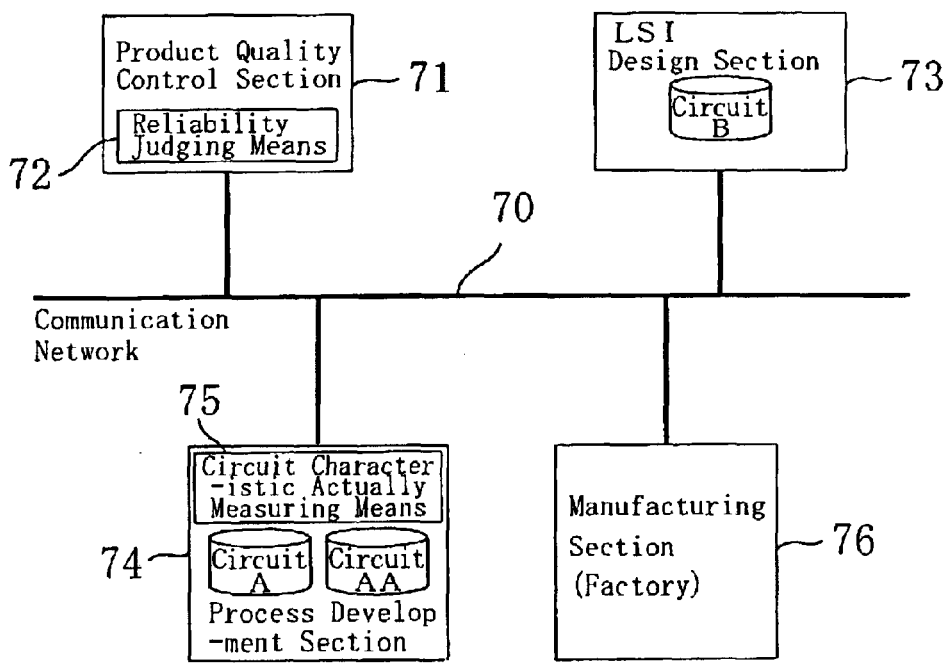
FIG. 4 shows an example of data on the degrees of degradation of the circuits and the ratio of the degree degradation of a newly designed circuit that has been predicted based on the data example.
FIG. 5 is a block diagram showing an example of a reliability evaluation system used in the first embodiment.

Although process development is typically pursued while varying manufacturing conditions, the present invention assumes the presence of two manufacturing conditions, which are an existing manufacturing condition (known manufacturing condition practiced conventionally or currently) and a new manufacturing condition. The new manufacturing condition is a condition obtained by, e.g., changing processing conditions in at least one of existing manufacturing steps (manufacturing steps compliant with the existing manufacturing condition) or a condition used in a process with 0.3-$\mu$m design rules, while the existing manufacturing condition is used in a process with 0.5-$\mu$m design rules.

Properties defined in the present invention include power consumption in addition to delay, current, and the like. The delay and current are particularly important properties for reliability evaluation.

Embodiment 1

FIG. 2 is a table showing the respective definitions of circuits A, B, AA, and BB used in a first embodiment. In the first embodiment, a ring oscillator circuit manufactured under an existing manufacturing condition is used as the circuit A (first circuit), an LSI manufactured under an existing condition is used as the circuit B (second circuit), a ring oscillator circuit composed of substantially the same elements as composing the circuit A and manufactured under a new manufacturing condition is used as the circuit AA (third circuit), and an LSI composed of substantially the same elements as composing the circuit B and manufactured under a new manufacturing condition is used as the circuit BB (fourth circuit).

Procedure of Reliability Evaluation

FIG. 1 is a flow chart illustrating a method for evaluating the reliability of an integrated circuit according to the first embodiment.

First, in Step ST11, the properties of the circuit A (ring oscillator) in a wafer or mounted chip are measured actually.

In Step ST12, the properties of the circuit A are stored in a memory. The actual measurement of the circuit properties is performed for the circuit A manufactured under the existing condition. The circuit A is provided in the form of, e.g., the ring oscillator provided in the wafer or mounted chip. The properties of the circuit A include data on a pre-degradation circuit delay and a post-degradation circuit delay in the ring oscillator. If the post-degradation circuit delay is measured actually, it is also possible to cause the ring oscillator before degradation to oscillate under actual operating conditions, measure a delay in the degraded ring oscillator after a lapse of a given period of time, and use the measured delay as the post-degradation circuit delay. To obtain a sufficient amount of degradation during actual measurement, however, an extremely long experiment period is normally required. To reduce the experiment period, therefore, an acceleration test in which degradation is accelerated under stricter operating conditions may also be performed. In the case of measuring the properties of the ring oscillator, the oscillating frequency thereof is measured directly in most cases. In that case, if a method which does not involve divider is assumedly used for simplicity by way of example, the pre- and post-degradation delays are calculated from the measured pre- and post-degradation oscillating frequencies in accordance with the following expressions (5) and (6):

$$\text{Pre-Degradation Delay} = 1/\text{Pre-Degradation Oscillating Frequency} \quad (5)$$

$$\text{Post-Degradation Delay} = 1/\text{Post-Degradation Oscillating Frequency}. \quad (6)$$

On the other hand, the properties of the circuit B (LSI) are simulated in Step ST13 by retrieving a netlist in which a structure of the circuit B is registered as well as the parameters thereof In Step ST14, the circuit properties are stored in the memory. In Step ST13, the circuit B which is the LSI manufactured under the existing manufacturing condition is analyzed by simulation. The simulation of the circuit properties can be performed in accordance with a gate-level timing degradation simulation method disclosed in U.S. Pat. No. 5,974,247 or Japanese Unexamined Patent Publication No. HEI 08-228118, a transistor-level reliability simulation method disclosed in "BTABERT User's Manual (BTA Technology Inc., USA)", or the like. The netlist and parameters of the circuit B (LSI) contain data necessary for simulation. The properties of the circuit B include data on pre- and post-degradation delays in the signal paths of the LSI.

FIG. 3 shows the relationship between pre-degradation signal path delays in the LSI and the degree of signal path delay degradation. Each of the points in FIG. 3 represents data on the signal paths of the LSI. In the drawing, the envelope of measured values is drawn. The present embodiment substantially coincides the design objective value of the signal path delays with the terminal point of the envelope (G in FIG. 3). Here, the pre-degradation signal path delay is the design objective value, e.g., a cycle time. A signal path exhibiting a pre-degradation signal path delay in the vicinity of the cycle time is a critical path. Because signal timing has no allowance in the critical path, it is likely to suffer earliest faulty operation due to degradation. For this reason, data on pre-degradation and post-degradation delays in the critical path of the signal paths is extracted.

Next, in Step ST15, the interrelation between the degree of delay degradation of the ring oscillator and the degree of delay degradation of the LSI is determined based on the respective pre- and post-degradation properties of the circuit A (ring oscillator) and the circuit B (LSI). The determined interrelation is stored in the memory in Step ST16. The interrelation is determined in Step ST15 as follows. For example, the degree of property degradation (which is the degree of delay degradation in the present embodiment) of the ring oscillator composing the circuit A and the degree of property degradation (which is the degree of delay degradation in the present embodiment) of the LSI composing the circuit B are calculated individually in accordance with the following expression (7):

$$\text{Degree of Property Degradation} = \quad (7)$$
$$(\text{Post-Degradation Property}/\text{Pre-Degradation Property}).$$

In short, the degree of property degradation is calculated as the ratio between the pre- and post-degradation properties. The post-degradation property is defined herein as a property after the circuit is used for a specified period.

Otherwise, the degrees of property degradation of the circuits A and B may also be defined by the following expression (7'):

$$\text{Degree of Property Degradation} = \quad (7')$$
$$(\text{Post-Degradation Property} - \text{Pre-Degradation Property})/$$
$$\text{Pre-Degradation Property}.$$

In short, the degree of property degradation is represented by a value obtained by dividing, by the pre-degradation property, a value obtained by subtracting the pre-degradation property from the post-degradation property.

A representation of the degree of property degradation is not limited to the expression (7) or (7'). The degree of property degradation can be represented by various other relational expressions each containing the pre- and post-degradation properties as parameters.

By using the degree of property degradation defined by the expression (7), the expression (7'), or the like, the interrelation therebetween is expressed as shown in the following expression (8):

$$\text{Interrelation} = \text{Degree of Property Degradation of Circuit A}: \quad (8)$$
$$\text{Degree of Property Degradation of Circuit B}.$$

If the expression (7') is used and delay is used as the property, the interrelation between the respective degrees of delay degradation of the circuits A and B is as expressed by the following expression (8'), since (Post-Degradation Delay−Pre-Degradation Delay)/Pre-Degradation Delay= (Post-Degradation Delay/Pre-Degradation Delay)−1 is satisfied:

$$\text{Interrelation}=(1.075-1):(1.025-1)=3:1 \quad (8')$$

In Step ST17, the properties (delays) of the circuit AA (ring oscillator) having substantially the same degree of property degradation (which is the degree of delay degradation in the present embodiment) as the circuit A and manufactured under the new manufacturing condition are measured actually from the wafer or mounted chip having the circuit AA. The circuit properties are stored in the memory in Step ST18. The properties of the circuit AA include data on pre- and post-degradation circuit delays and the like.

Next, in Step ST19, the degree of property degradation (which is the degree of delay degradation in the present embodiment) of the circuit BB is estimated from the interrelation and the degree of property degradation (which is the degree of delay degradation in the present embodiment) of the circuit AA.

In general, the circuit BB has substantially the same degree of property degradation (which is the degree of delay degradation in the present embodiment) as the circuit B and is manufactured under the new manufacturing condition. The estimation of the degree of degradation of a property, such as delay, is performed based on the relation represented by the following expression (9):

$$\begin{aligned}\text{Degree of Property Degradation of Circuit BB} &\approx \\ (\text{Degree of Property Degradation of Circuit B}/ \\ \text{Degree of Property Degradation of Circuit A}) \times \\ \text{Degree of Property Degradation of Circuit AA} = \\ \text{Interrelation} \times \text{Degree of Property Degradation of Circuit AA}.\end{aligned} \quad (9)$$

The process allows the degree of property degradation of the circuit BB to be estimated by extrapolation from the degree of property degradation (which is the degree of delay degradation in the present embodiment) of the circuit AA by using the interrelation between the respective degrees of property degradation of the circuits A and B.

FIG. 4 shows an example of data on the degrees of degradation of the circuits A, B, and AA and the ratio of the degree of degradation of the circuit BB (newly designed circuit) predicted based on the exemplary data. The ratio between the respective degrees of degradation (Degree of Delay Degradation−1=(Post-Degradation Delay−Pre-Degradation Delay)/Pre-Degradation Delay) of the individual circuits shown in FIG. 4 is obtained by assuming that the degree of degradation of the circuit B is 1.

Next, in Step ST20, the property value (Degree of Delay Degradation−1) of the circuit BB and the degree of delay degradation thereof are stored in the memory. The value of the degree of delay degradation can be used for LSI design.

Next, in Step ST21, it is judged whether or not each of the degree of property degradation (which is the degree of delay degradation in the present embodiment) of the circuit BB and the post-degradation property (which is the post-degradation delay in the present embodiment) of the LSI manufactured under the new manufacturing condition, which is obtained from the degree of property degradation of the circuit BB, are within the predetermined range of permissible values (i.e., reliability judgment). The result of judgment is outputted in Step ST22.

Figure 8:
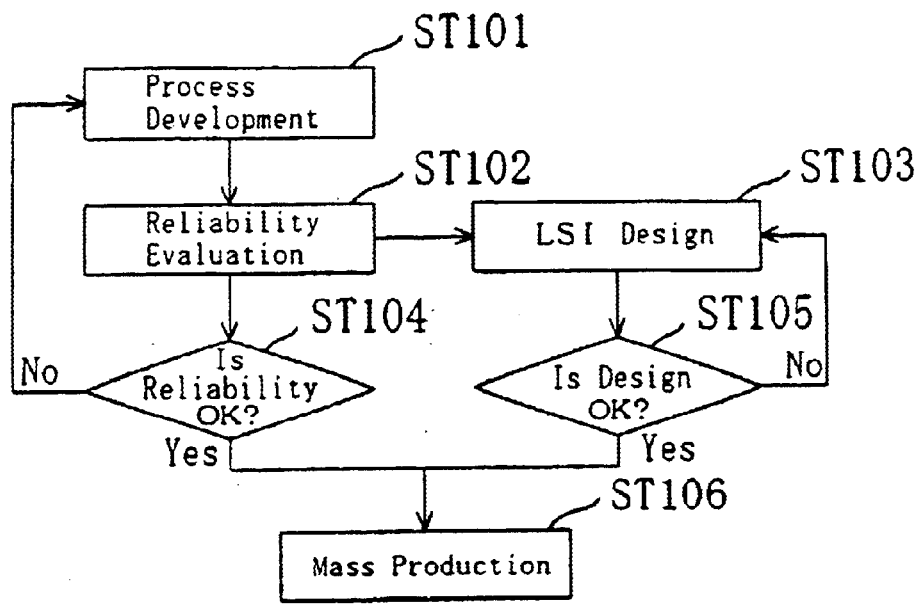
FIG. 8 is a flow chart illustrating a typical process flow from the development of a device to the mass production thereof.
Figure 9:
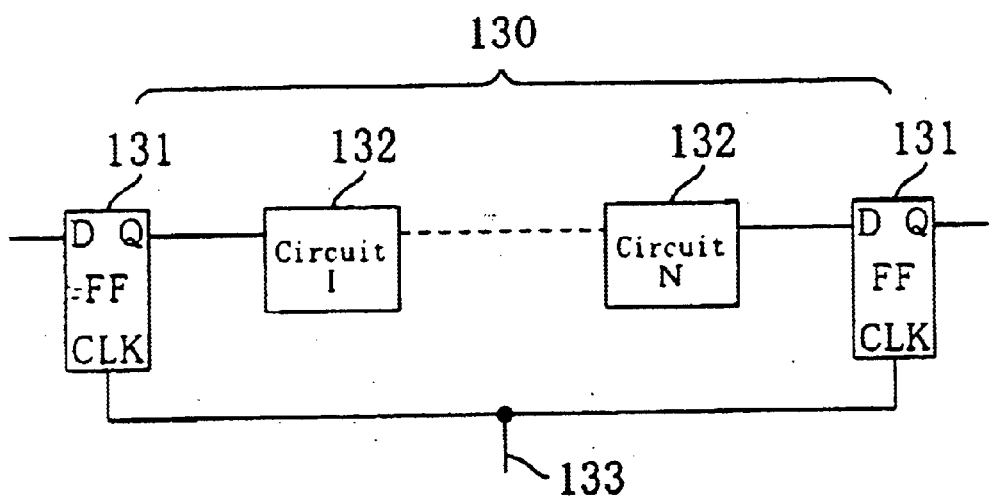
FIG. 9 is a circuit diagram showing a structure of a basic unit (signal path) in a typical LSI.
Figure 10:
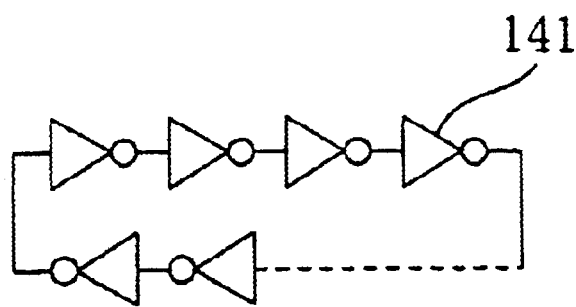
FIG. 10 is a circuit diagram showing a structure of a typical ring oscillator circuit composed of a plurality of inverters connected in an annular configuration to oscillate.
Figure 11:
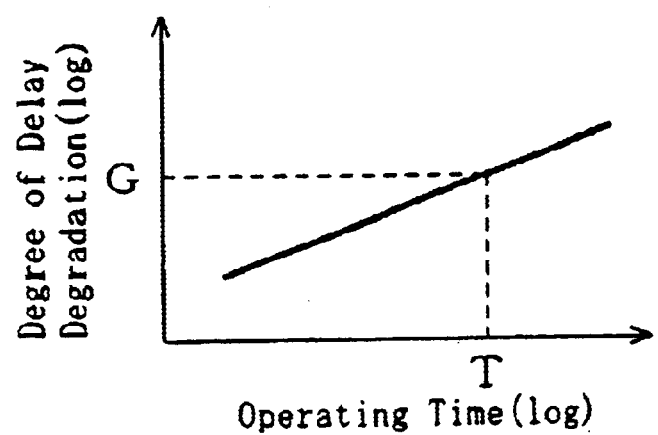
FIG. 11 shows the relationship between operating time and the degree of delay degradation of a typical circuit.

The judgment corresponds to the process performed in Step ST104 in the flow chart of FIG. 8. No problem is encountered if the degree of delay degradation and the post-degradation delay are within the range of permissible values. If the degree of delay degradation and the post-degradation delay are larger than the permissible values, they serve as the criterion for reviewing the manufacturing condition.

If delay is used as the circuit property, as in the present embodiment, the degree G of delay degradation of the LSI manufactured under the new manufacturing condition, which is included in the properties of the circuit BB, is used as the derating factor in designing the circuit BB. The degree G of delay degradation is used as a design margin in conjunction with delay varying factors including power-supply voltage variation, temperature variation, and manufacturing fluctuation. The post-degradation delay may also be determined as shown in the following expression (10) by further incorporating a simulation error as a derating factor S:

$$t \text{ worst (After Degradation)} = t \text{ typ (Before Degradation)} \times P \times V \times T \times G \times S \quad (10).$$

If even the power-supply voltage variation, temperature variation, manufacturing fluctuation, and simulation error are preliminarily incorporated in the standard pre-degradation delay t typ to provide t typ', only the derating factor G may also be used as a design margin, as in the following expression (11):

$$t \text{ worst (After Degradation)} = t \text{ typ' (Before Degradation)} \times G \quad (11).$$

By thus determining the interrelation between the degradation of the ring oscillator (circuit A) and the degradation of the LSI (circuit B) each manufactured under the existing condition and adding data on the degradation of the ring oscillator (circuit AA) manufactured under the new manufacturing condition, the degradation of the LSI (circuit BB) manufactured under the new manufacturing condition can be predicted. This allows the reliability of a process performed under the new manufacturing condition to be evaluated based on the predicted value of the reliability of an actual LSI, not on the predicted value of the reliability of the conventional ring oscillator which undergoes excessive degradation.

Since the present embodiment thus allows reliability evaluation reflecting the actual LSI and operating conditions for the LSI, an excessively large design margin is no more provided. By providing the design margin including the predicted derating factor (delay property), LSI design under the new manufacturing condition can be undertaken before manufacturing.

As the circuit AA, a circuit having at least a degree of property degradation which is substantially the same as or close to that of the circuit A can be used. As the circuit BB, a circuit having at least a degradation property which is substantially the same as or close to that of the circuit B can be used. However, the circuits A and AA need not necessarily have the same degrees of property degradation and the circuits B and BB need not necessarily have the same degrees of property degradation, either, provided that they are close to each other to a certain degree.

Figure 12:
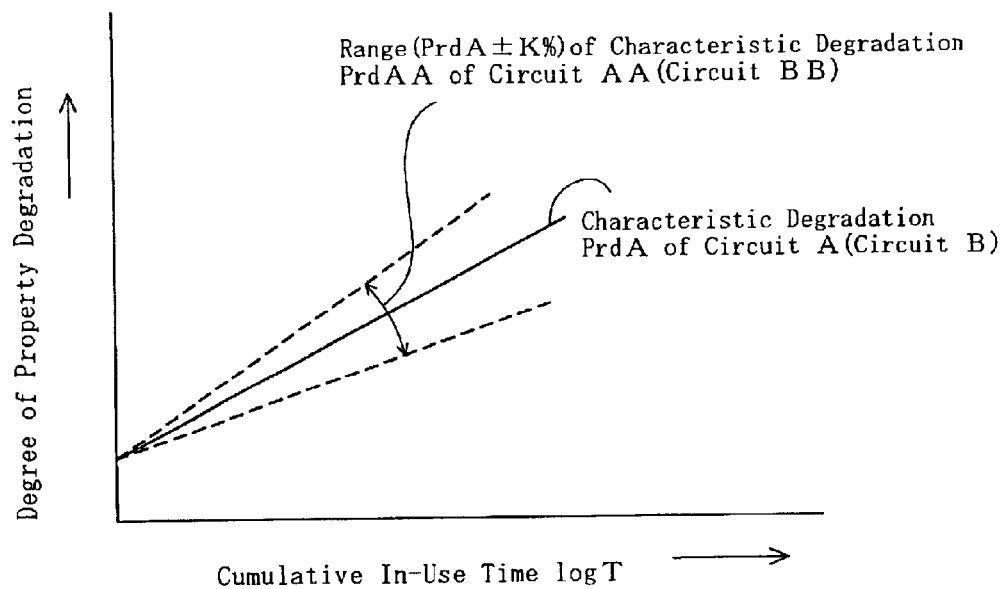
FIG. 12 approximately shows a property model varying with a cumulative in-use period (log T).

FIG. 12 approximately shows a property degradation model which varies with a cumulative in-use period (log T). As shown in the drawing, the property is degraded linearly as the cumulative in-use period (log T) increases. If the gradient of the degradation line is assumed to be the degree of degradation, it is sufficient for the degree of property degradation PrdAA (or PrdBB) of the circuit AA (or circuit BB) to fall within the range of PrdA (or PrdB)±K (%) centering around the degree PrdA (or PrdB) of property degradation of the circuit A (or the circuit B). The value of K differs depending on the type of a circuit. If a design margin allowed for the circuit is large, K with a large value (e.g., 30%) is used. If the design margin allowed for the circuit is not so large, K with a small value (e.g., 10%) is used. In other words, a circuit having the degree of degradation within the range of PrdA (or PrdB)±K (%) is used as the circuit AA (or circuit BB). However, the degree of property degradation need not necessarily be defined as the gradient of the line shown in FIG. 12 (particularly when the degradation property model shown in FIG. 12 is not followed). As the degree of property degradation, a value obtained by, e.g., dividing, by the in-use period, the difference between a property value before use and a property value after a lapse of a given in-use period may also be calculated.

If a comparison is made between the respective properties of the circuit A (or circuit B) and the circuit AA (or circuit BB) manufactured by using processes belonging to the same generation under different manufacturing conditions, the circuit AA (or circuit BB) of the same design (composed of identical elements) as the circuit A (or circuit B) is used preferably. Since the circuits of the same design have the same circuit connections and the same circuit constants so that a difference in the degree of degradation results from a difference in manufacturing condition. Even if the circuits are not composed of the absolutely the same elements, they can be considered to have the same design provided that the difference between the respective degrees of property degradation of the circuits is within the range of ±1%. If a comparison is made between the respective properties of the circuit A (or circuit B) and the circuit AA (or circuit BB) manufactured by using processes belonging to different generations under different manufacturing conditions (one manufacturing condition belongs to one generation), a circuit considered to be substantially equal in performance and the degree of degradation to the circuit A (or circuit B) may be used appropriately as the circuit AA (or circuit BB) since there is no circuit of the same design (composed of identical elements) as the circuit A. The terminology "substantially equal (the same)" indicates that the difference in the degree of property degradation is in the range of ±5%.

In this case, if the gate width W ($\mu$m)/gate length L ($\mu$m) ratio of a transistor in a ring oscillator manufactured by using a process belonging to the 0.5-$\mu$m generation under an existing manufacturing condition is 4 $\mu$m/0.5 $\mu$m, it is appropriate to select, as a circuit equal thereto and belonging to the 0.3-$\mu$m generation, a circuit having the same circuit structure and a circuit constant scaled in accordance with the process generation ratio, such as 2.4 $\mu$m/0.3 $\mu$m, or a circuit constant close thereto. Alternatively, there may also be used a method of selecting a circuit which is expected to be substantially equal based on the relational data between circuits and amounts of degradation that has been accumulated in the past.

As the circuit B, one typical LSI may be selected appropriately or a plurality of LSIs may also be selected appropriately. If the plurality of LSIs are selected, it is also possible to obtain, as the property of the circuit B, a mean value of a plurality of property values obtained from the plurality of LSIs. This is because the property value slightly varies depending on the method of selecting the circuit B and higher reliability is achieved if the interrelation is determined in Step ST15 based on the property values of the plurality of LSIs than if the interrelation is determined based on the property value of one LSI. As shown in the column of the circuit B shown in FIG. 4, the property value of one LSI is 1.0. If, e.g., "1.0", "0.1", and "0.9" are obtained as the properties of three LSIs as the LSI of the circuit B, the mean value 1.02 thereof or the maximum value 1.1 thereof may also be used as the property value of the circuit B. Alternatively, the property value of the circuit BB can also be expressed in a range by using the mean value $\mu$ of the circuit property values obtained from the plurality of LSIs and the triple of the standard deviation $\sigma$ thereof, as shown in the following expression (12):

$$\text{Property of Circuit BB} = ((\mu \pm 3\sigma)/\text{Property Value of Circuit A}) \times \text{Property Value of Circuit AA}. \quad (12)$$

Likewise, one critical path in an LSI may be selected appropriately as the circuit B or signal paths containing a plurality of critical paths may also be selected appropriately.

It is to be noted that the expressions (8) and (9) are only exemplary functions for evaluating degradation as uniformly as possible. Instead of the expressions (8) and (9), another function for degradation evaluation can also be used.

Reliability Evaluation System

FIG. 5 is a block diagram of an example of a reliability evaluation system used in the present embodiment.

As shown in FIG. 5, the reliability evaluation system is composed of: a product quality control section 71; an LSI design section 73; a process development section 74; and a manufacturing section 76 (factory), which are disposed at locations distant from each other and connected to each other by a communication network 70.

The process development section 74 for developing a process and determining a manufacturing condition has circuit property actual measuring means 75 by which the properties of the circuit A (ring oscillator manufactured under the existing manufacturing condition) and the circuit AA (ring oscillator manufactured under the new manufacturing condition) are measured, which are the processes of Steps ST11 and ST17 shown in FIG. 1. The measured properties are transmitted to the product quality control section 71 via the communication network 70. On the other hand, the LSI design section 73 transmits data (data stored in a netlist or the like) on the circuit B (LSI) to the product quality control section 71 via the communication network 70. The product quality control section 71 has the function of performing the steps enclosed in the broken lines of FIG. 1 by using reliability evaluating means 72 and performs the processes of these steps. Specifically, the properties of the circuit B are obtained by circuit property simulation in Step ST13, the interrelation between the respective degrees of property degradation of the circuits A and B is determined in Step ST15, the degree of property degradation of the circuit BB is predicted in Step ST19, the reliability is judged in Step ST21, and the result of judgment is outputted in Step ST22. Consequently, the derating factor which is the property of the circuit BB is transmitted from the product quality control section 71 to the LSI design section 73 via the communication network 70. Further, the result of reliability judgment is transmitted from the product quality control section 71 to the manufacturing section 76 via the communication network 70 to serve as a criterion for initiating mass production.

Thus, the reliability evaluation system shown in FIG. 5 is composed of the individual sections 71, 73, 74, and 76 for performing various processes which are disposed at locations distant from each other and connected to each other by the communication network 70. This allows the various processes to be distributed to the distant locations and efficient data reception and transmission to be performed by the communication network irrespective of the distant locations.

It is also possible to automate the processes enclosed in the broken lines of FIG. 1 which are performed by using the reliability judging means 72. In that case, automation is effected in a form having a graphical user interface (GUI) such as a browser. It is appropriate to allow the user of the product quality control section 71 to set a directory for circuit data on the GUI, execute a process command, and display the result of final judgment.

As the communication network 70, an arbitrary system can be used provided that it is capable of performing remote communication.

If the product quality control section 71 shown in FIG. 5 offers, under a commission from the other associated sections 73, 74, and 76, the service of performing the process of reliability evaluation and judgment described in the present embodiment, the product quality control section 71 may bill the other associated sections 73, 74, and 76 in compensation for the service. Since the communication network is used, data for billing is easily available so that the service is easily implemented.

The form in which the individual means are distributed to the different sections shown in the present embodiment is only exemplary and an arbitrary form can be assumed.

Although the present embodiment has been described by using the hot carrier degradation phenomenon as an example, a phenomenon covered by the present invention is not limited to the physical phenomenon. The bias temperature instability phenomenon cited above in the description of the prior art technology is a phenomenon in which, if it occurs in, e.g., a CMOS transistor, the threshold voltage and drain current of the transistor vary with time in response to circuit operation due to an unstable interface between a gate oxide film and a silicon substrate. Although the bias temperature instability phenomenon is different in mechanism from the hot carrier degradation phenomenon, it causes the same property variation as the hot carrier degradation phenomenon in terms of circuit properties in that delay and the like vary. This causes the necessity to incorporate delay resulting from the bias temperature instability phenomenon in the design margin and therefore the delay is included in the "properties" of the present invention. A phenomenon covered by the present invention may also be a degradation phenomenon involving either one or both of the hot carrier degradation phenomenon and the bias temperature instability phenomenon. The present embodiment can also be applied to a property other than delay.

Embodiment 2

Figure 6:
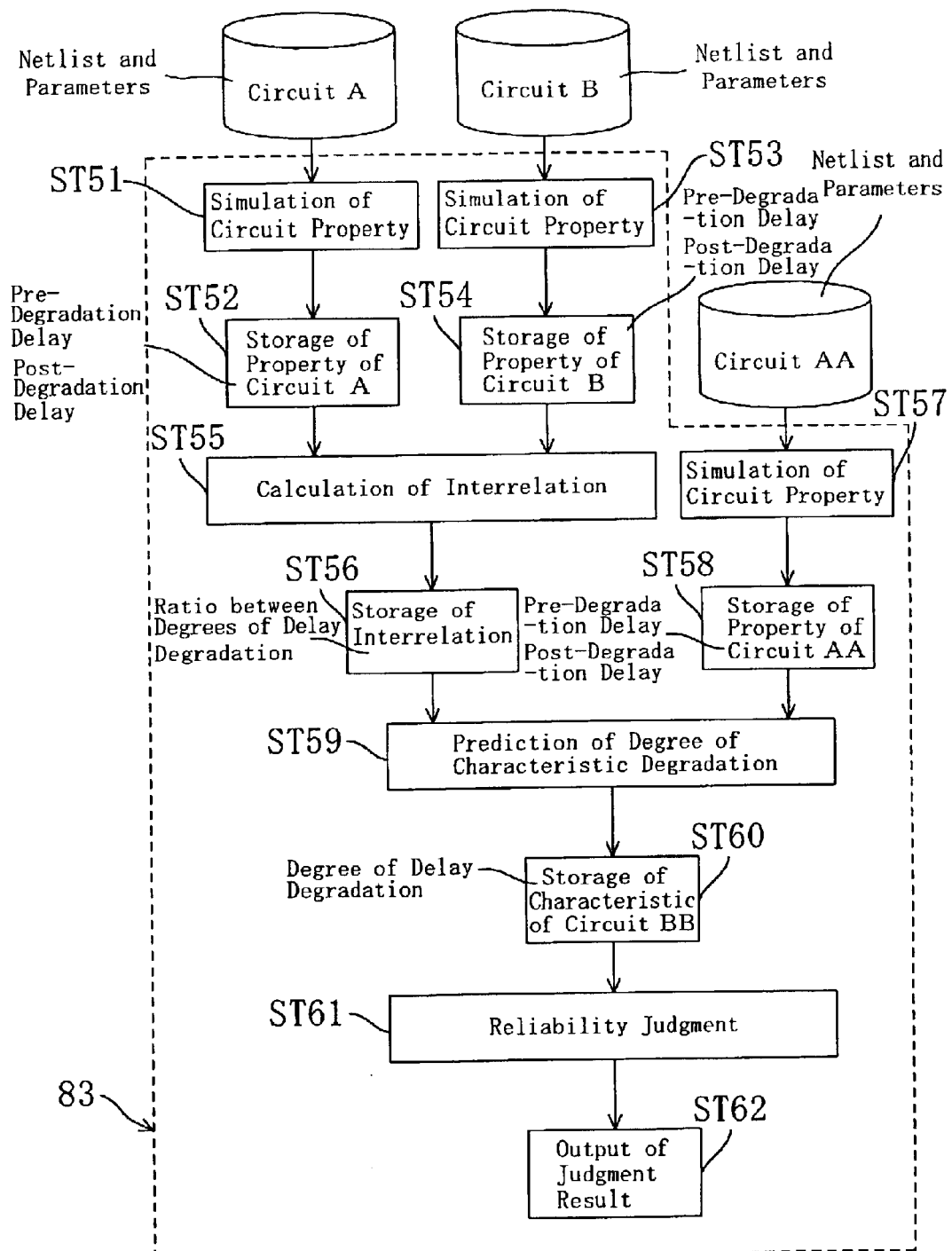
FIG. 6 is a flow chart illustrating a method for evaluating the reliability of an integrated circuit according to a second embodiment of the present invention.

FIG. 6 is a flow chart illustrating a method for evaluating the reliability of an integrated circuit according to a second embodiment of the present invention.

First, in Step ST51, the properties of a circuit A (ring oscillator) are simulated by retrieving a netlist in which a structure of the circuit A is registered as well as the parameters thereof In Step ST52, the result of simulating the properties of the circuit A is stored in a memory. The netlist and parameters of the circuit A (ring oscillator) contain data necessary for simulation. The simulation of the circuit properties is performed for the circuit A manufactured under an existing condition. The properties of the circuit A include data on a pre-degradation circuit delay and a post-degradation circuit delay in the ring oscillator. In the case of simulating the properties of the ring oscillator, the oscillating frequency thereof is simulated in most cases. In that case, the pre- and post-degradation delays are calculated from the simulated pre- and post-degradation oscillating frequencies of the ring oscillator in accordance with the foregoing expressions (5) and (6).

On the other hand, the circuit properties of a circuit B (LSI) are simulated in Step ST53 by retrieving a netlist in which a structure of the circuit B is registered as well as the parameters thereof In Step ST54, the circuit properties are stored in the memory. At this time, the circuit B which is the LSI manufactured under an existing manufacturing condition is analyzed by simulation. The netlist and parameters of the circuit B (LSI) contain data necessary for simulation. The properties of the circuit B include data on pre- and post-degradation delays in the signal paths of the LSI.

The simulation of the circuit properties in Steps ST51 and ST53 can be performed in accordance with the gate-level timing degradation simulation method disclosed in each of the aforementioned patent publications or with the transistor-level reliability simulation method disclosed in the "BTABERT User's Manual".

Next, in Step ST55, the interrelation between the degree of property degradation of the ring oscillator and the degree of property degradation of the LSI is determined based on the respective properties of the circuit A (ring oscillator) and the circuit B (LSI). The determined interrelation is stored in the memory in Step ST56. The interrelation is determined in Step ST55 by using the expression (7) or (7') and represented as shown in the expression (8) or (8').

In Step ST57, the circuit properties of a circuit AA (ring oscillator) exhibiting substantially the same degree of property degradation as the circuit A and manufactured under a new manufacturing condition are obtained by simulation performed by retrieving the netlist of the circuit AA as well as the parameters thereof The circuit properties are stored in the memory in Step ST58. The properties of the circuit AA include data on pre- and post-degradation circuit delays and the like.

Next, in Step ST59, the degree of property degradation of a circuit BB is predicted from the interrelation and the degree of property degradation of the circuit AA. The circuit BB has substantially the same degree of property degradation as the circuit B and is manufactured under the new manufacturing condition. The prediction of the properties is performed based on the foregoing expression (9). The process allows the properties of the circuit BB to be estimated by extrapolation from the properties of the circuit AA by using the interrelation between the circuits A and B.

Next, in Step ST60, the property value and degree of delay degradation of the circuit BB are stored in the memory. The value of the degree of delay degradation can be used for LSI design.

Next, in Step ST61, it is judged whether or not each of the degree of property degradation of the circuit BB and the post-degradation property of the LSI manufactured under the new manufacturing condition is within the predetermined range of permissible values. The result of judgment is outputted in Step ST62.

The judgment corresponds to the process performed in Step ST104 in the flow chart of FIG. 8. No problem is encountered if the degree of delay degradation and the post-degradation delay are within the range of permissible values. If the degree of delay degradation and the post-degradation delay are larger than the permissible values, they serve as the criterion for reviewing the manufacturing conditions.

On the other hand, the degree G of delay degradation of the LSI manufactured under the new manufacturing condition, which is included in the properties of the circuit BB, is used as the derating factor in designing the LSI. The degree G of delay degradation is used as a design margin in conjunction with delay varying factors including power-supply voltage variation, temperature variation, and manufacturing fluctuation. The post-degradation delay may also be determined as shown in the foregoing expression (10) by further incorporating a simulation error as a derating factor S. If even the power-supply voltage variation, temperature variation, manufacturing fluctuation, and simulation error are preliminarily incorporated in the standard pre-degradation delay t typ to provide t typ', only the derating factor G may also be used as a design margin, as in the foregoing expression (11).

By thus determining the interrelation between the degree of degradation of the ring oscillator (circuit A) and the degree of degradation of the LSI (circuit B) each manufactured under the existing condition and adding data on the degree of degradation of the ring oscillator (circuit AA) manufactured under the new manufacturing condition, the degree of degradation of the LSI (circuit BB) manufactured under the new manufacturing condition can be predicted. This allows the reliability of a process performed under the new manufacturing condition to be evaluated based on the predicted value of the reliability of an actual LSI, not on the predicted value of the reliability of the conventional ring oscillator which undergoes excessive degradation.

Since the present embodiment thus allows reliability evaluation reflecting the actual LSI and operating conditions for the LSI, an excessively large design margin is no more provided.

In particular, the present embodiment allows more effective reliability evaluation than the first embodiment since it can obtain the properties (which are delay properties in the present embodiment) of the circuits A and AA by simulation, without actually measuring them, which is different from the first embodiment.

As the circuit AA, a circuit having at least a degree of property degradation which is substantially the same as or close to that of the circuit A can be used, similarly to the first embodiment. If a comparison is made between the respective degrees of property degradation of the circuits A and AA manufactured by using processes belonging to the same generation under different manufacturing conditions, the circuit AA of the same design (composed of identical elements) as the circuit A can be used. If a comparison is made between the respective degrees of property degradation of the circuits A and AA manufactured by using processes belonging to different generations under different manufacturing conditions (one manufacturing condition belongs to one generation), a circuit considered to be substantially equal in performance and the degree of degradation to the circuit A may be used appropriately as the circuit AA since there is no circuit of the same design (composed of identical elements) as the circuit A. The terminology that the degree of property degradation and the elements contained are "substantially equal (the same)" indicates a case as described in the first embodiment.

As the circuit B, one typical LSI may be selected appropriately or a plurality of LSIs may also be selected appropriately, similarly to the first embodiment. If the plurality of LSIs are selected, it is also possible to obtain, as the property of the circuit B, a mean value of a plurality of property values obtained from the plurality of LSIs. Likewise, one critical path in an LSI may be selected appropriately as the circuit B or signal paths containing a plurality of critical paths may also be selected appropriately.

As functions for evaluating degradation as uniformly as possible, functions other than the expressions (8) and (9) can also be used instead, similarly to the first embodiment.

Reliability Evaluation System

Figure 7:
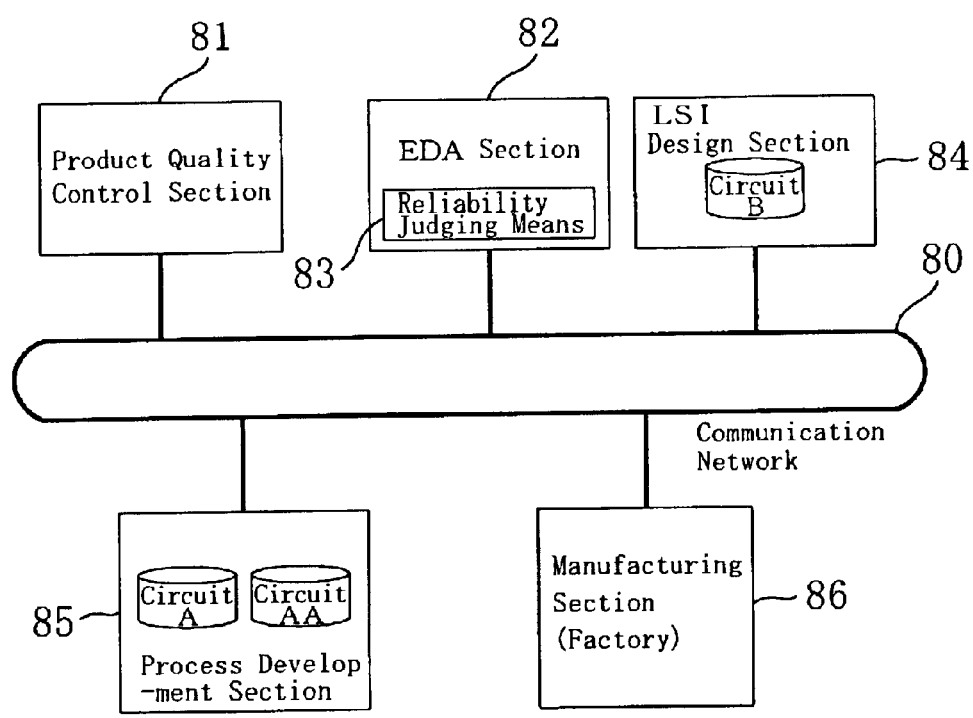
FIG. 7 is a block diagram showing an example of a reliability evaluation system used in the second embodiment.

FIG. 7 is a block diagram of an example of a reliability evaluation system used in the present embodiment.

As shown in FIG. 7, the reliability evaluation system is composed of a product quality control section 81; an EDA section 82; an LSI design section 84; a process development section 85; and a manufacturing section 86 (factory), which are disposed at locations distant from each other and connected to each other by a communication network 80. The EDA section 82 used herein indicates a section in which EDA (Electronic Design Automation) in charge of computer software is disposed. In the present embodiment, the EDA section 82 is provided independently of the other sections.

In the present embodiment, reliability judging means 83 is disposed in the EDA section 82, not in the product quality control section 81, and the process development section 85 does not have circuit property actual measuring means, which is different from the first embodiment.

The LSI design section 84 transmits data (a netlist or the like) on the circuits A and B (LSI) to the EDA section 82 via the communication network 80. The EDA section 82 has the function of performing the steps enclosed in the broken lines of FIG. 6 by using the reliability judging means 83. By using the reliability judging means 83 provided via the communication network 80, the product quality control section 81 reads the netlists and parameters of the circuits A and AA from the process development section 85, reads the netlist and parameters of the circuit B from the LSI design section 84, obtains the respective properties of the circuits A and B by circuit property simulation in Steps ST51 and ST53, obtains the interrelation between the respective properties of the circuits A and in Step ST61, and outputs the result of judgment in Step ST62.

Consequently, the derating factor of the circuit BB is transmitted from the product quality control section 81 to the LSI design section 84 via the communication network 80. Further, the result of reliability judgment is transmitted from the product quality control section 81 to the factory 86 via the communication network 80 to serve as a criterion for initiating mass production.

Thus, the reliability evaluation system shown in FIG. 7 is composed of the individual sections 81, 82, 84, 85, and 86 for performing various processes which are disposed at locations distant from each other and connected to each other by the communication network 80. This allows the various processes to be distributed to the distant locations and efficient data reception and transmission to be performed by the communication network irrespective of the distant locations. Since the reliability judging means 83 is provided from the EDA section 82, the product quality control section 81 need not own the reliability judging means 83. It is sufficient for the product quality control section 81 to just use it. In the case of using the reliability judging means 83 in the form of computer software on the communication network 80, if the EDA section 82 maintains and supports the software, the product quality control section 81 need not maintain the software as if it owns the software so that it is allowed to just use the software.

It is also possible to automate the processes enclosed in the broken lines of FIG. 6 which are performed by using the reliability judging means 83. In that case, automation is effected in a form having a graphical user interface (GUI) such as a browser. It is appropriate to allow the user of the product quality control section 81 to set a directory for circuit data on the GUI, execute a process command, and display the result of final judgment.

As the communication network 80, an arbitrary system can be used provided that it is capable of performing remote communication.

The product quality control section 81 may bill the other associated sections in compensation for the process of reliability evaluation and judgment described in the present embodiment, similarly to the quality control section 71 according to the first embodiment.

The form in which the individual means are distributed to the different sections shown in the present embodiment is only exemplary and an arbitrary form can be assumed.

Other Embodiments

Although each of the first and second embodiments has described the method for evaluating delay properties as the properties of circuits (circuit A, circuit B, circuit AA, and circuit BB), the circuit properties according to the present invention are not limited to such embodiments. For example, circuit currents (power consumption) can also be evaluated as circuit properties.

Although each of the foregoing embodiments has determined the interrelation between the respective degrees of property degradation of the circuits A and B and estimated the degree of property degradation of the circuit BB by using the interrelation, only if the interrelation between the respective degrees of property degradation of the circuits A and B is determined, it can be used for various purposes including the estimation of various properties in LSI design.

What is claimed is:

1. A method for evaluating a property of an integrated circuit which varies depending on a manufacturing condition therefor, the method comprising the steps of:

(a) obtaining respective properties of first and second circuits each manufactured under a first manufacturing condition before and after the properties thereof are degraded as a result of using the first and second circuits for a specified period;

(b) determining, based on the properties before and after degradation obtained in the step (a), an interrelation between respective degrees of property degradation of the first and second circuits;

(c) determining a degree of degradation of a property of a third circuit manufactured under a second manufacturing condition, a difference between the respective degrees of property degradation of the first and third circuits being within a specified range; and (d) estimating, based on the interrelation and on the degree of property degradation of the third circuit, a degree of degradation of a property of a fourth circuit manufactured under the second manufacturing condition, a difference between the respective degrees of property degradation of the second and fourth circuits being within a specified range.

2. The method of claim 1, wherein the degree of property degradation of the third circuit is substantially the same as the degree of property degradation of the first circuit and the degree of property degradation of the fourth circuit is substantially the same as the degree of property degradation of the second circuit.

3. The method of claim 1, wherein respective ring oscillators are used as the first and third circuits and respective logic circuits are used as the second and fourth circuits.

4. The method of claim 1, wherein each of the steps (a) to (c) includes obtaining the property of any one of the first, second, and third circuits by simulation and obtaining the respective properties of the other circuits by actual measurement after manufacturing.

5. The method of claim 1, wherein a delay in each of the circuits is used as the property of the circuit.

6. The method of claim 1, wherein the step (a) includes using, as the degree of property degradation of each of the first and second circuits, a value obtained by dividing, by the property before degradation, a value obtained by subtracting the property before degradation from the property after degradation resulting from the use of the circuit and the step (b) includes using, as the interrelation, a ratio between the respective degrees of degradation of the circuits.

7. The method of claim 6, further comprising the step of: comparing, for judgment, the estimated degree of property degradation of the fourth circuit or the property after degradation obtained therefrom with a predetermined permissible value.

8. The method of claim 1, wherein the third circuit contains substantially the same elements as the first circuit and the fourth circuit contains substantially the same elements as the second circuit.

* * * * *